United States Patent [19]

Williams et al.

[11] Patent Number: 5,051,811
[45] Date of Patent: Sep. 24, 1991

[54] SOLDER OR BRAZING BARRIER

[75] Inventors: Ralph E. Williams, Richardson; David B. Rhine, Denton; John Bedinger, Garland; Larry G. Barnett, Wylie, all of Tex.

[73] Assignee: Texas Instruments Incorporated, Dallas, Tex.

[21] Appl. No.: 302,852

[22] Filed: Jan. 27, 1989

Related U.S. Application Data

[63] Continuation of Ser. No. 91,807, Aug. 31, 1987, Pat. No. 4,827,610.

[51] Int. Cl.⁵ .................. H01L 23/50; H01L 23/34
[52] U.S. Cl. ...................................... 357/68
[58] Field of Search ............. 357/87, 71, 68; 29/840; 427/97

[56] References Cited

U.S. PATENT DOCUMENTS

| | | | |
|---|---|---|---|
| 3,449,640 | 6/1969 | Franklin | 351/65 |
| 3,483,615 | 12/1969 | Gottfried | 351/68 |
| 3,501,342 | 3/1970 | Haberecht et al. | 351/65 |
| 3,549,784 | 12/1970 | Hargis | 351/65 |
| 4,360,968 | 11/1982 | D'Amico et al. | 29/840 |
| 4,544,577 | 10/1985 | May | 427/97 |
| 4,765,864 | 8/1988 | Holland et al. | 437/203 |
| 4,794,093 | 12/1988 | Tong et al. | 357/55 |
| 4,807,022 | 2/1989 | Kazior et al. | 357/81 |
| 4,827,610 | 5/1989 | Williams et al. | 29/840 |
| 4,837,536 | 6/1989 | Honjo | 351/67 |

FOREIGN PATENT DOCUMENTS

| | | | |
|---|---|---|---|
| 62-128179 | 6/1987 | Japan | 357/65 |
| 62-268147 | 11/1987 | Japan | |
| 2046514 | 11/1980 | United Kingdom | 357/68 |
| 2136203 | 9/1984 | United Kingdom | |
| 2150749 | 7/1985 | United Kingdom | |

OTHER PUBLICATIONS

Crimi et al, "Landless Hole Circuit Card", IBM TDB, vol. 9, No. 10, Mar./67, pp. 1310–1311.
Balderes et al, "Glass-Metal Module to Chip Intersection", vol. 14, No. 11, Apr. 72, pp. 3224.
Magdo, "Pyramid Shaped Electrical Feedthrough in Silicon Wafers", IBM TDB, vol. 19, No. 4, Sep./76, pp. 1232–1233.

Primary Examiner—Andrew J. James
Assistant Examiner—Viet Q. Nguyen
Attorney, Agent, or Firm—Rene' E. Grossman; Melvin Sharp

[57] ABSTRACT

A method of preparing a substrate such as a semiconductor chip or ceramic thin film having vias for soldering to a substrate requires that a first metal that is resistive to solder bonding be deposited on the backside of the semiconductor device. The deposited metal is removed from the surface of the semiconductor device, leaving the vias of the semiconductor device having the first metal deposited through them. This technique is useful in any requirement requiring a solder or brazing barrier. This is, a photolithographic process in conjunction with a refractory or nonsolderable metal deposit is used to achieve an alloy or solder barrier.

23 Claims, 4 Drawing Sheets

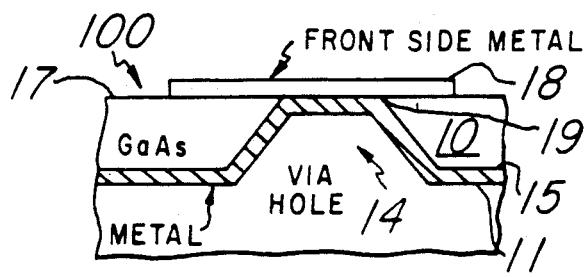
PRIOR ART Fig.1
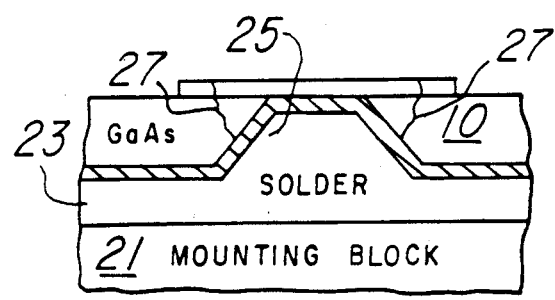
PRIOR ART Fig.2
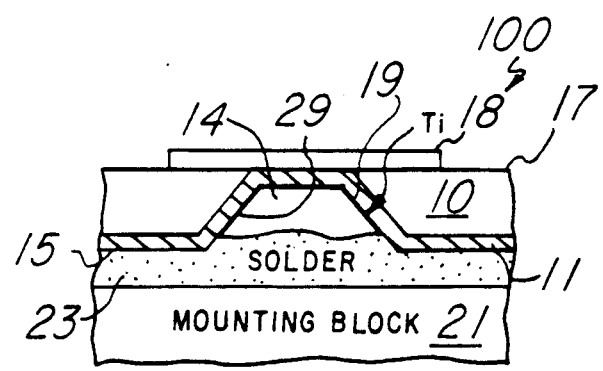
Fig.3

SOLDER OR BRAZING BARRIER

This is a continuation of application Ser. No. 07/091,807, filed Aug. 31, 1987 now U.S. Pat. No. 4,827,610.

BACKGROUND OF THE INVENTION

This invention relates to a semiconductor device and a solder or brazing barrier with a refractory or nonsolderable metal deposits in order to achieve an alloy or solder barrier. It has a particular application to thin brittle wafers having vias such as a semiconductor chip or a substrate.

Semiconductor devices such as thin film network components, gallium arsenide MMICs (monolithic microwave integrated circuits) and discrete field effect transistors commonly employ vias (feed through holes in the device) which serve as a conduit for connecting a backside ground plane to front side circuit metalization.

FIG. 1 illustrates his arrangement in which a semiconductor chip 10, which in the embodiment of FIG. 1 is a gallium arsenide device. This embodiment has a ground plane established by a metal deposit 11 that is deposited on the backside 15 of the semiconductor chip 10. A circuit configuration is provided on the front side 17 of the semiconductor chip 10 in the form of a metalization 18. The metalization 18 is connected to the ground plane 11 by a via 14 that serves as a conduit for connecting the ground plane 11 to the front side metalization 18 at point 19.

Referring to FIG. 2, the vias in the semiconductor chip 10 are essential to high performance MMICs. These MMICs in complex circuit arrangements are connected to additional circuits which may generate substantial heat when in operation. Therefore, for these complex circuits MMIC's are mounted to a substrate such as that illustrated in FIG. 2 and denoted as mounting block 21. This is very often required to achieve good thermal characteristics. However, when the semiconductor device 10 is mounted to the substrate 21 through the use of soldering, the solder 23 tends to be drawn up into the via 14 as indicated at 25 filling all or most of the via 14 as is shown in FIG. 2. The differential expansion between the solder and the brittle semiconductor chip 10 such as gallium arsenide or a ceramic thin film can cause the material near the via to crack, as is illustrated at 27. Such cracks can cause either immediate device failures or propagate under operating stress and produce future device failures. Although such cracks do not develop, experience with MMIC devices, other semiconductor devices and ceramic thin films, illustrates this effect to be very serious in both yield and reliability.

SUMMARY OF THE INVENTION

A method of preparing a substrate such as a semiconductor chip or ceramic thin film having vias for soldering to a substrate requires that a first metal that is resistive to solder bonding be deposited on the backside of the semiconductor device. The deposited metal is removed from the surface of the semiconductor device, leaving the vias of the semiconductor device having the first metal deposited through them. This technique is useful in any requirement requiring a solder or brazing barrier. That is a photolithographic process in conjunction with a refractory or nonsolderable metal depsoite is used to achieve a alloy or solder barrier.

The steps of removing the first metal from the semiconductor device while leaving it within the via includes the steps of covering the first metal with a photosensitive material. After the photosensitive material has been placed over the first metal, it is exposed to light with a predetermined intensity for a predetermined period of time. The intensity and time are selected such that the resist reacts with the light that is over the semiconductor device but not for a period long enough for the light to penetrate the resist within the via.

The activated resist is removed from the the first material. The first material is then stripped through a stripping process, such as a plasma reaction, leaving the first material within the via.

The materials found to be successful in this operation is titanium, titanium/tungsten nichrome or aluminum. Each of these materials has the characteristic of being readily oxidized when exposed to air and thus prevents the bonding of solder to their surfaces.

It is the object of the invention to provide a method of manufacturing semiconductor devices that may be soldered to other mounting blocks or substrates without fear of cracking due to solder filling the via holes.

It is yet another object of the invention to provide a method of manufacturing a semiconductor device having via holes that prevent the wicking of solder up through the via holes and thus prevent cracking. The disclosed method is easily performed without the expense of having to develop a precise mask for semiconductor device.

It is yet another object of the invention to provide a method of providing an alloy or solder barrier that is capable of being defined with a high resolution and is stable at high temperatures.

These and other objects and advantages of the invention will be more apparent from a reading of the specification in conjunction with the figures in which:

BRIEF DESCRIPTION OF THE DRAWINGS

FIG. 1 is a prior art illustration of a semiconductor device that includes a via hole:

FIG. 2 shows a prior art illustration of the mounting of a semiconductor device with via holes to a mounting block:

FIG. 3 is a diagram illustrating a semiconductor device having a via hole according to the invention that is mounted to a mounting block:

DETAILED DESCRIPTION OF THE EMBODIMENTS

Figure 4:
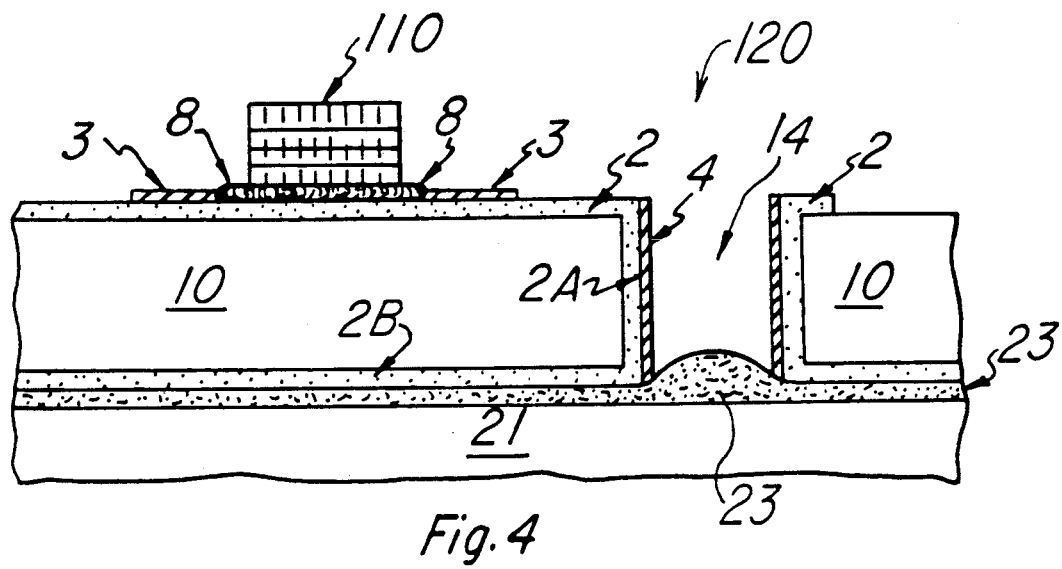
FIG. 4 is a diagram of a thin film ceramic substrate with plated via holes according to the invention.

In FIG. 3, to which reference should now be made, there is shown a semiconductor device 100 that includes a substrate 10 that is mounted to a second substrate or mounting block 21 and held in place by solder 23. The steps used in mounting the semiconductor device 10 to the mounting block 21 provide for placing a layer of solder 23 on the mounting block 21. The semiconductor device is then placed on the solder 23 and heated, according to standard semiconductor techniques such as placing the combination of the mounting block 21 and semiconductor device 100 in an oven, until the solder melts. The solder when it melts adheres to the conductor 11 but is prevented from wicking within a via hole 14 because the via hole is coated with a material 19. The material 19 in the embodiment of FIG. 3 and FIG. 4 is a material, such as titanium, titanium/tungsten, nichrome or aluminum, all of which are readily oxidized and their oxide is resistive to the bonding of the solder 23. This circuit configuration thus has the advantage of providing contact between the conductor 11 and the metalization 18 which comprises a circuit that is part of the semiconductor device 100 without fear of the solder due to different temperature cofficients expanding and cracking the semiconductor device 100.

In FIG. 4 a circuit 120 includes a substrate 10 which is a thin film ceramic substrate having components 110 soldered to a conductor 2 by solder 8. The solder 8 is retained by a barrier mask 3, which is manufactured by the processes disclosed herein. A via 14 in the substrate 10 has a metal 4 such as titanium titanium tungsten nichrome or aluminum deposited on its inner walls. The substrate 10 is soldered to a mounting block 21 b solder 23 which is prevented from wicking up the via 14 by the metal 4.

Figure 5A:
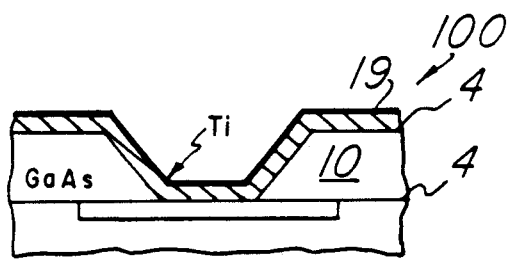
Figure 5B:
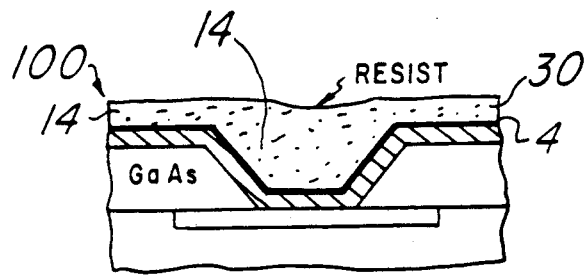

The process by which the embodiments of FIGS. 3 and 4 are manufactured include all standard semiconductor processing steps used manufacture the semiconductor device 100. Referring to FIG. 5a, after the manufacture of the semiconductor device 100 or the circuit 120 are completed including via formation, a relatively thin layer of titanium 4 or other similar elements as discussed above is deposited on the substrate 10 which in the embodiment of FIG. 5 is a gallium arsenide substrate but the disclosed process also includes the steps used to manufacture the thin film substrate of FIG. 4 either through, evaporation or sputtering on the backside of the substrate 10 that the semiconductor device 100 is manufactured on. The backside of the substrate 10 is then covered with a photoresist 30 or is spun with a photoresist using conventional techniques. Note that the photoresist fills the via 14. This is illustrated in FIG. 5b. During this process, the photoresist tends to planarize the slice.

Figure 5C:
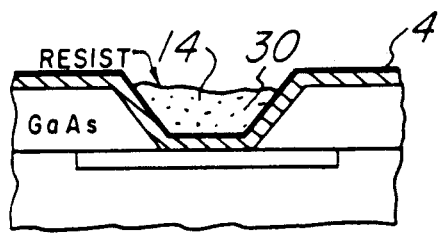
Figure 5D:
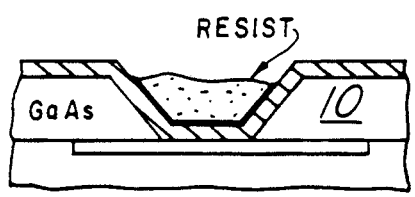
Figure 5E:
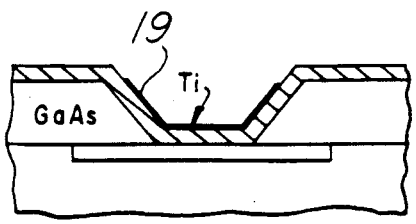

Referring to FIG. 5c, a blanket optical exposure and subsequent development removes the photoresist 4 of the optically activated photoresist 30 from the backside surface of the substrate 10. It should be noted that this process that the resist used is 5 micrometers thick AZ 4620 resist manufactured by Shippley Manufuacturing Co. and is exposed for 300 seconds at 4mW/cm square. This process leave some resist 30 within the via hole 14. The exposed titanium is then removed by plasma etching or alternate means as is illustrated in 5d.

When titanium is used as the material 4 and plasma etching is in the stripping process, a gas of 95% $CF_4O_2$ and 8% $O_2$ operates effectively. Lastly, the residual resist in a via hole is removed by a solvent or other means, thus leaving the configuration of FIG. 5e which can be readily used in the embodiment of FIGS. 3 and 4.

Figure 6F:
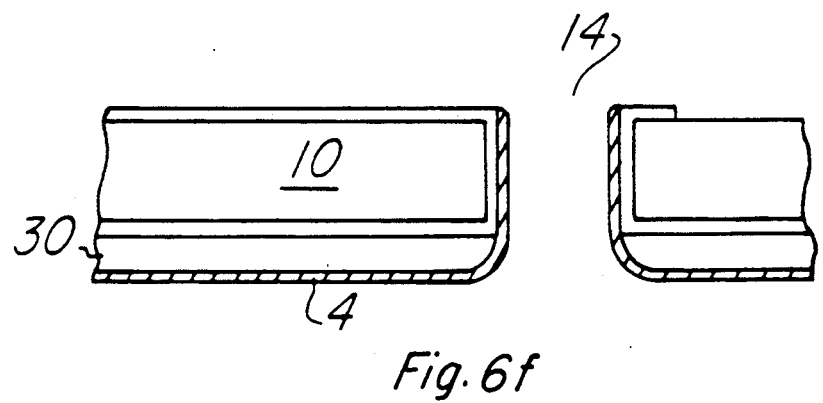
FIGS. 5a –5e and 6a–6g illustrate the steps used to manufacture the semiconductor devices of FIGS. 3 and 4.
Figure 6G:
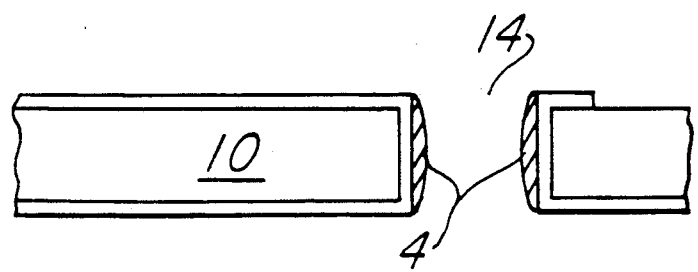
Figure 6A:
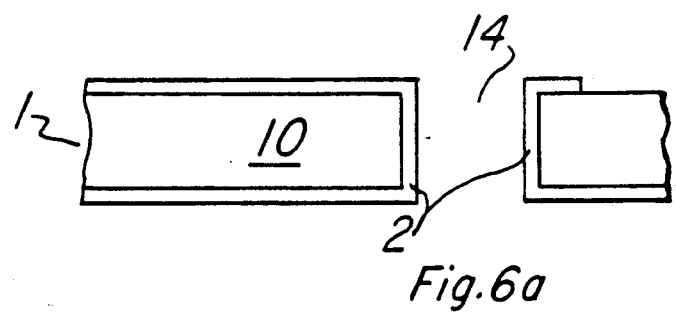
Figure 6B:
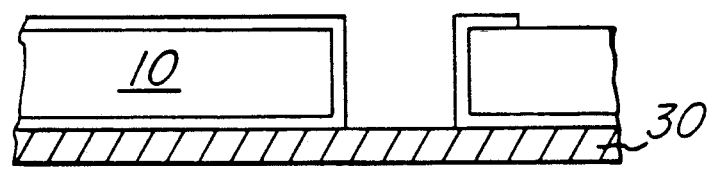

FIGS. 6 illustrates an alternate embodiment of the invention in which the backside of the substrate 10 is covered with a positively dry photoresist 30 (FIG. 6a and 6b). The front side of the substrate 10 is then exposed to ultraviolet light 31 as is illustrated in FIG. 6c. The steps beginning with FIG. 6e are then completed.

Figure 6C:
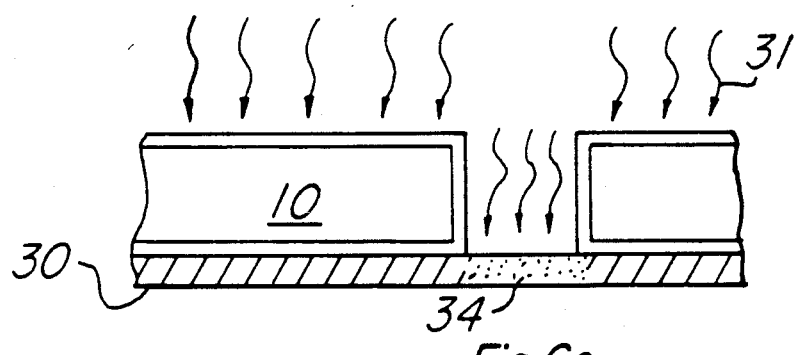
Figure 6D:
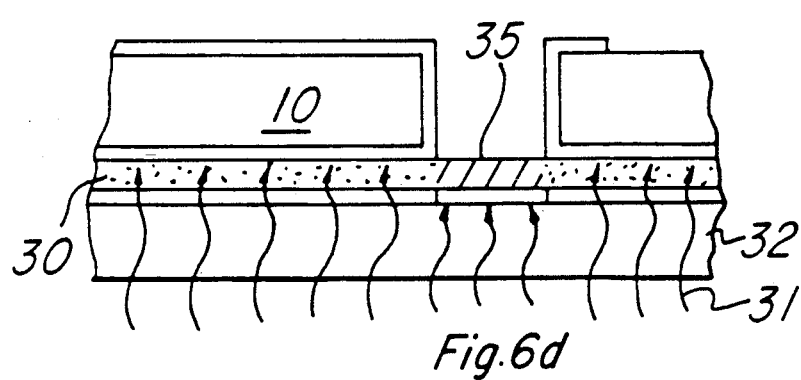
Figure 6E:
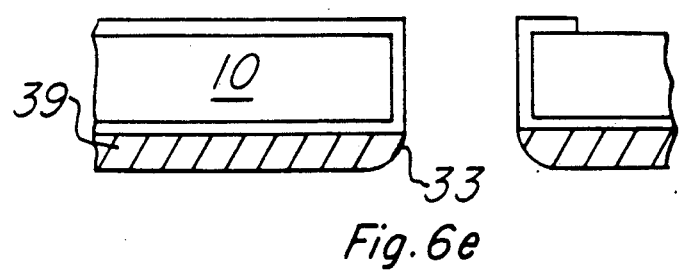

In FIG. 6d a second embodiment of the method of FIG. 6c includes a negative photoresist 39 applied to the backside of the substrate 10. A phototool 32 is aligned over the via 14 and ultraviolet light 31 is used to expose the backside of the substrate 10. The photoresist 35 over the via 14 is removed by the film development process and the substrate 10 and photoresist 39 are baked in an oven to round the corners 33 of the photoresist at the via as is illustrated in FIG. 6e.

In FIG. 6f one of the above referenced materials is deposited over the photoresist 39 and in the via 14. Finally the photoresist 39 is removed with the appropriate lift off chemical process leaving the via walls covered with a material 4 that the solder 23 will not adhere to (FIGS. 6f and 6g).

We claim:

1. A semiconductor structure resistive to cracking about vias, comprising:
    a semiconductor layer having first and second opposing surfaces and a via extending therethrough, said semiconductor layer including a wall portion along the via, said wall portion defining a first opening along the first surface and a second opening along the second surface;
    a first conductive layer positioned on said first semiconductor surface and extending over the via;
    a mounting block;
    a second conductive layer positioned along the semiconductor wall portion and in ohmic contact with said first conductive layer, said second conductive layer extending toward said second semiconductor surface;
    a layer of material resistive to the bonding of solder covering at least a portion of the second conductive layer in the via; and
    a solder layer positioned between said semiconductor layer and the mounting block and providing an ohmic connection between the mounting block and the second conductive layer.

2. The semiconductor structure of claim 1, wherein the first and second conductive layers cover said first opening along said first semiconductor surface and the solder layer covers said second opening along said second semiconductor surface to form a volume.

3. The semiconductor structure of claim 1, wherein said layer of material resistive to the bonding of solder thereto comprises titanium, tungsten, nichrome or aluminum.

4. The semiconductor structure of claim 1, wherein the second conductive layer extends between the solder layer and said second semiconductor surface.

5. The semiconductor structure of claim 1, wherein said semiconductor layer comprises III-V compound semiconductor material.

6. The semiconductor structure of claim 1, wherein said semiconductor layer comprises gallium arsenide.

7. The semiconductor structure of claim 1, wherein said first conductive layer forms a portion of a circuit configuration.

8. The semiconductor structure of claim 1, wherein said layer of material resistive to the bonding of solder thereto comprises any material that is readily oxidized, the material readily oxidized, when oxidized, being resistive to the bonding of solder thereto.

9. The semiconductor structure of claim 1, wherein said layer of material resistive to the bonding of solder is conductive.

10. A microelectronic structure that retains solder about vias, comprising:
  (a) a first layer of material having first and second opposing surfaces and a via extending therethrough, said first layer having a wall portion along the via, said wall portion defining a first opening along the first surface and a second opening along the second surface;
  (b) an electrically conductive layer positioned on said first surface of said first layer and extending along said wall portion to said second surface of said first layer to provide electrical contact between said first and second surfaces;
  (c) a layer of material resistive to the bonding of solder thereto covering at least a portion of the conductive layer which extends along the wall portion of said via to prevent wicking of solder through said second opening in said second surface through the said via;
  (d) a mounting block; and
  (e) a layer of solder attaching said conductive layer to said mounting block.

11. The microelectronic structure of claim 10, wherein said layer of material resistive to the bonding of solder comprises titanium, tungsten, nichrome or aluminum.

12. The microelectronic structure of claim 10, wherein said layer of material resistive to the bonding of solder is electrically conductive.

13. The microelectronic structure of claim 10, wherein said first layer comprises a ceramic material.

14. The microelectronic structure of claim 10, wherein said conductive layer forms a portion of a circuit configuration.

15. The microelectronic structure of claim 10, wherein layer of material resistive to the bonding of solder thereto comprises any material that is readily oxidized, the material readily oxidized, when oxidized, being resistive to the bonding of solder thereto.

16. The microelectronic structure of claim 14, wherein said conductive layer extends between said layer of solder and said second surface of said first layer and extends along said second surface of said first layer.

17. A microelectronic structure that inhibits the misplacement of solder about microelectronic circuit devices thereon, comprising:
  (a) a substrate having first and second opposing surfaces;
  (b) an electrically conductive layer positioned on said first surface of said substrate;
  (c) a layer of material resistive to the bonding of solder thereto positioned on said conductive layer, forming a barrier mask to retention of solder thereon;
  (d) a microelectronic circuit configuration on said second surface of said substrate; and
  (e) a layer of solder connected to said conductive layer.

18. The microelectronic structure of claim 17, wherein said layer of material resistive to the bonding of solder comprises titanium, tungsten, nichrome or aluminum.

19. The microelectronic structure of claim 17, wherein said layer of material resistive to the bonding of solder is conductive.

20. The microelectronic structure of claim 17, wherein said layer of material resistive to the bonding of solder thereto comprises a ceramic material.

21. The microelectronic structure of claim 17, wherein said conductive layer forms a portion of a circuit configuration.

22. The microelectronic structure of claim 17, wherein said layer of material resistive to the bonding of solder thereto comprises any material that is readily oxidized, the material readily oxidized, when oxidized, being resistive to the bonding of solder thereto.

23. A semiconductor structure resistive to cracking about vias, comprising:
  a semiconductor layer having first and second opposing surfaces and a via extending therethrough from said first surface to said second surface, said via including a wall portion;
  a first electrically conductive layer positioned on said first semiconductor surface;
  a second electrically conductive layer positioned along said via in ohmic contact with said first conductive layer, said second conductive layer extending toward said second semiconductor surface;
  a layer of material resistive to the bonding of solder disposed within said via covering at least a portion of said second conductive layer within said via; and
  a solder layer positioned on said second surface providing an ohmic connection to said second conductive layer.

* * * * *